United States Patent [19]
Severson

[11] Patent Number: 6,130,818
[45] Date of Patent: Oct. 10, 2000

[54] ELECTRONIC ASSEMBLY WITH FAULT TOLERANT COOLING

[75] Inventor: Mark H. Severson, Rockford, Ill.

[73] Assignee: Hamilton Sundstrand Corporation, Windsor Locks, Conn.

[21] Appl. No.: 09/321,007

[22] Filed: May 27, 1999

[51] Int. Cl.[7] .................................................. H05K 7/20
[52] U.S. Cl. ......................... 361/690; 361/695; 361/818
[58] Field of Search ................................. 165/80.2, 80.3, 165/80.4, 185, 104.33, 121–123; 174/15.1, 15.2, 16.1, 35 R; 361/687–688, 690–704, 707, 715, 818

[56] References Cited

U.S. PATENT DOCUMENTS

| | | |
|---|---|---|
| 3,741,292 | 6/1973 | Aakalu et al. . |
| 4,233,645 | 11/1980 | Balderes et al. . |
| 4,315,300 | 2/1982 | Parmerlee et al. . |
| 4,327,399 | 4/1982 | Sasaki et al. . |
| 4,635,709 | 1/1987 | Altoz . |
| 4,771,365 | 9/1988 | Cichocki et al. . |
| 5,268,812 | 12/1993 | Conte . |
| 5,285,347 | 2/1994 | Fox et al. . |
| 5,424,916 | 6/1995 | Martin . |
| 5,471,850 | 12/1995 | Cowans . |
| 5,508,884 | 4/1996 | Brunet et al. . |
| 5,731,954 | 3/1998 | Cheun ....................................... 361/699 |
| 5,778,970 | 7/1998 | Chang . |
| 5,842,514 | 12/1998 | Zapach et al. ...................... 165/104.33 |
| 5,943,211 | 8/1999 | Havey et al. ........................... 361/699 |

*Primary Examiner*—Gregory Thompson
*Attorney, Agent, or Firm*—Wood, Phillips, VanSanten, Clark & Mortimer

[57] ABSTRACT

An electronic assembly provides fault tolerant cooling for the electrical components of the electronic assembly to prevent premature failure of the electronic components due to overheating. The electronic assembly includes a chassis (20) having an exterior surface (22) and an interior cavity (24), a plurality of heat generating components (26) mounted in the cavity (24) and in heat exchange relation to the chassis (20) to reject generated heat to the chassis (20), and a fault tolerant heat exchanger (28) on the exterior surface (22) in heat exchange relation with the chassis (20). The heat exchanger (28) includes a passive heat sink (30) and an active heat sink (32). The passive heat sink (30) is configured and sized to reject the generated heat of the electrical components (26) at a first rate from the chassis (20) to the environment surround the chassis (20) via radiation and natural convection. The active heat sink (32) includes one or more coolant passages (34) and is configured and sized to reject the generated heat at a second rate from the chassis (20) to a coolant air flow that is flowed through the one or more coolant passages (34), with the second rate being greater than the first rate. The active heat sink (32) includes a conductive thermal path (36) from the chassis (20) to the passive heat sink (30) to reject the generated heat at the first rate from the chassis (20) to the passive heat sink (30) with no coolant air being flowed through the one or more passages (34).

9 Claims, 2 Drawing Sheets

ELECTRONIC ASSEMBLY WITH FAULT TOLERANT COOLING

FIELD OF THE INVENTION

This invention relates to electronic assemblies, and more particularly to electronic assemblies including heat exchangers to dissipate the heat generated by electrical components of the assembly.

BACKGROUND OF THE INVENTION

It is known to provide heat exchangers on electrical components and assemblies to dissipate the heat generated by the electrical components. Typically, such heat exchangers are provided either in the form of a passive heat sink or an active heat sink. Passive heat sinks rely upon natural convection, radiation and conduction to dissipate the heat, while active heat sinks dissipate the heat to a coolant that is flowed over or through the heat sink by a pump or fan, or in the case of some moving vehicles, by the relative velocity between the vehicle and the fluid, such as air, in which the vehicle is traveling.

Typically, the goal of such heat exchangers is to maintain electrical components within their normal operating temperature range, which is the temperature range that allows sustained operation of the electrical components within specifications without reducing the required operating life. An additional goal of such heat exchangers may be to ensure that, during an abnormal operating condition, the electrical components never exceed their maximum operating temperature range, which is the temperature range that allows a component to perform its required function without reducing the required operating life of the component as long as there are limited number of occurrences of the component operating at the maximum operating temperature range, with each occurrence being for a limited time period.

A primary advantage of passive heat sinks is their simplicity because they require no fans, pumps, ducts, conduits, or other means for flowing a coolant over or through the passive heat sink. One problem with passive heat sinks is that they may experience difficulty in providing a sufficient heat rejection rate to adequately cool certain electrical components, such as power electronics including motor drives, power converters, and power inverters.

A primary advantage of active heat sinks is that they can provide more effective heat dissipation in comparison to passive heat sinks and thus are often more suitable to those electrical components that require a high rate of heat dissipation. One problem with active cooling is that if a fan or pump fails, a loss of cooling will occur and may potentially damage the electrical components through overheating.

In some environments, such as in an aircraft, it is not uncommon for there to be a requirement that EMI shielding be provided for the electrical components and/or that each of the electrical components in the assembly be mounted in an enclosed interior cavity that restricts and/or prevents active air flow over the electrical components. These requirements can complicate the problem of dissipating heat generated by the electrical components.

SUMMARY OF THE INVENTION

It is the principal object of the invention to provide a new and improved electronic assembly including fault tolerant cooling. It is another object to provide an electronic assembly that can accommodate electrical components that require heat dissipation, while allowing the electrical components to be mounted inside a chassis.

According to one facet of the invention, an electronic assembly including fault tolerant cooling is provided. The assembly includes a chassis having an exterior surface and an interior cavity, a plurality of heat generating electrical components mounted in the cavity and in heat exchange relation to the chassis to reject generated heat to the chassis, and a fault tolerant heat exchanger on the exterior surface of the chassis and in heat exchange relation with the chassis. The heat exchanger includes a passive heat sink to reject the generated heat at a first rate from the chassis to an environment surrounding the chassis via radiation and natural convection, and an active heat sink, including at least one coolant passage, to reject the generated heat at a second rate from the chassis to a coolant that is flowed through the at least one coolant passage, with the second rate being greater than the first rate. The active heat sink includes a conductive thermal path from the chassis to the passive heat sink to reject the generated heat at the first rate from the chassis to the passive heat sink with no coolant being flowed through the active heat sink.

In one form of the invention, the active and passive heat sinks are a unitary part of the chassis.

In another form of the invention, the passive and active heat sinks are separate components that are fixed to the chassis in an assembled state.

According to one aspect of the invention, the first rate of heat rejection is sufficient to maintain each electrical component of the plurality of electrical components within a maximum operating temperature range for the electrical component, and the second rate of heat rejection is sufficient to maintain each electrical component of the plurality of electrical components within a normal operating temperature range for the electrical component.

Other objects and advantages will become apparent from the following specification taken in connection with the accompanying drawings.

DETAILED DESCRIPTION OF THE PREFERRED EMBODIMENTS

Figure 1:
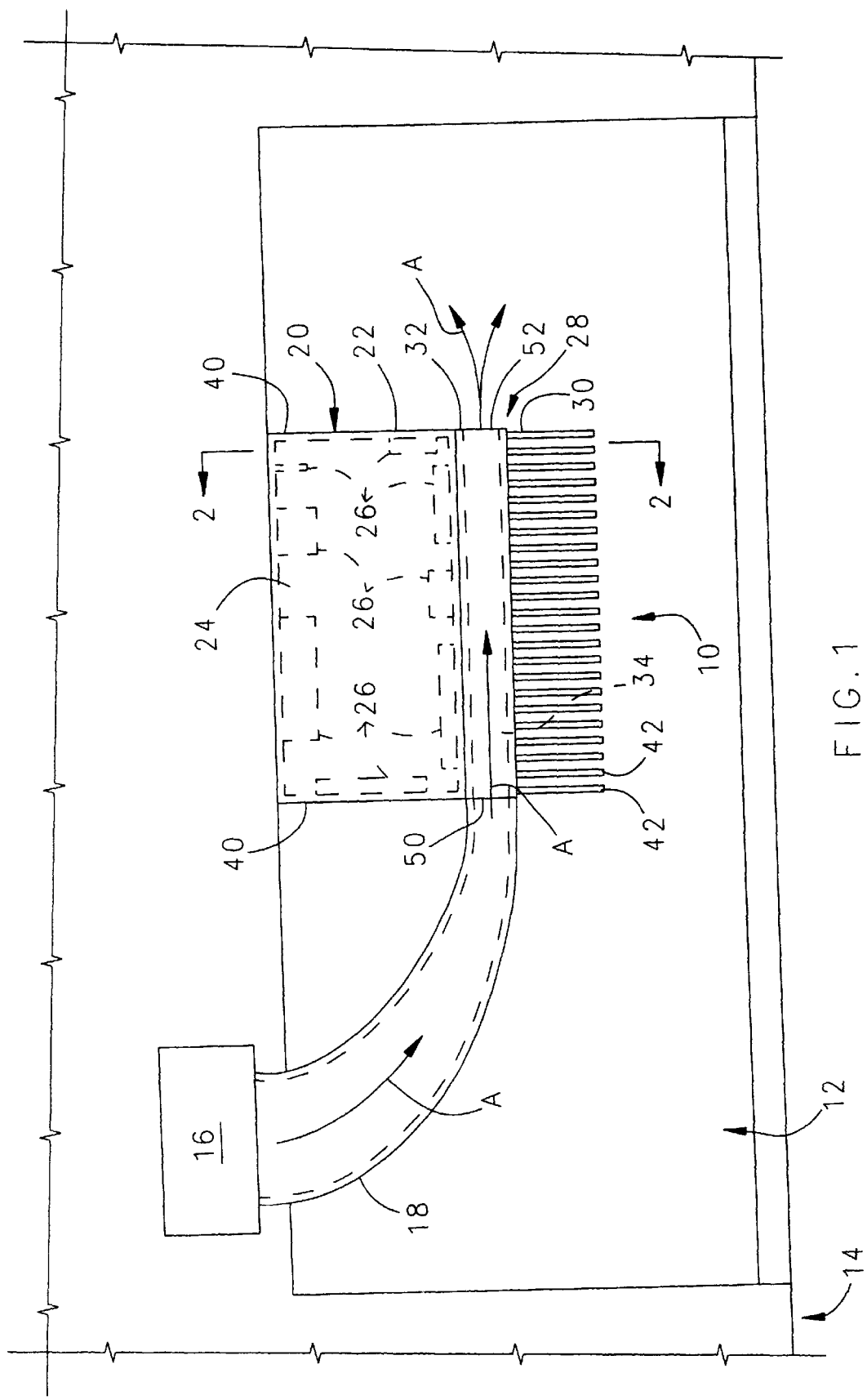
FIG. 1 is a diagrammatic illustration of an electronic assembly embodying the invention mounted within a compartment of a vehicle carrying the electronic

An exemplary embodiment of an electronic assembly made according to the invention is described herein and is illustrated in the drawings in connection with a compartment or bay of an aircraft that includes a coolant source in the form of a forced air flow. However, it should be understood that the invention may find utility in other applications and that no limitation to use in connection with an aircraft or with a forced air coolant is intended except insofar as expressly stated in the appended claims. With reference to FIG. 1, an electronic assembly 10 is shown mounted in an enclosed compartment or bay 12 of an aircraft 14. The aircraft includes a source 16 of forced air flow, such as a fan, compressor, or ram air duct, that provides a coolant air flow, as indicated by arrow A through a duct 18 to the electronic assembly 10.

Figure 2:
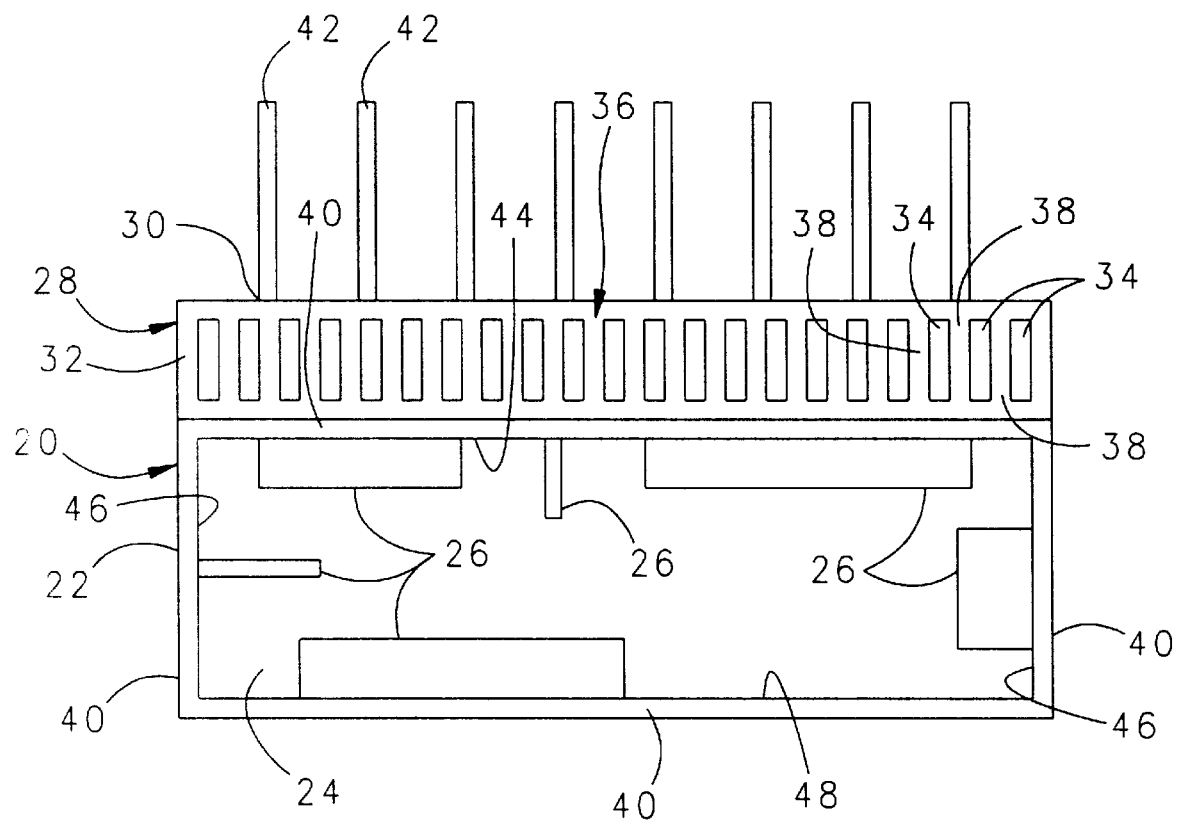
FIG. 2 is a section view of the electronic assembly taken along the line 2—2 in FIG. 1.

As best seen in FIG. 2, the electronic assembly includes a chassis 20 having an exterior surface 22 and an interior cavity 24, a plurality of heat generating electrical components 26 mounted in the cavity 24 and in heat exchange relation to the chassis 20 to reject generated heat to the chassis 20, and a fault tolerant heat exchanger 28 on the exterior surface 22, in heat exchange relation with the chassis 20.

The heat exchanger 28 includes a passive heat sink 30 and an active heat sink 32. The passive heat sink 30 is configured and sized to reject the generated heat of the electrical component 26 at a first rate from the chassis 20 to the environment surrounding the chassis 20 via radiation and natural convection. The active heat sink 32 includes one or more coolant passages 34 and is configured and sized to reject the generated heat at a second rate from the chassis 20 to the coolant air that is flowed through the one or more, preferably plural, coolant passages 34, as indicated by arrows A, with the second rate being greater than the first rate. The active heat sink 32 further includes a conductive thermal path 36 from the chassis 20 to the passive heat sink 30. The conductive thermal path 36 is configured and sized to reject the generated heat of the electrical components at the first rate from the chassis 20 to the passive heat sink 28 with no coolant air being flowed from the duct 18 through the one or more passages 34 of the active heat sink 28. The conductive thermal path 36 is shown in the form of walls 38 that extend from the chassis 20 to the passive heat sink 30, defining the coolant passages 34.

Preferably, the second rate of heat rejection is sufficient to maintain each of the electrical components 26 within a normal operating temperature range that allows sustained operation of the electrical component 26 within its specified parameters without negatively impacting the required life of the electrical component 26. The use of the active heat exchanger 32 in this manner allows the electronic assembly 10 to provide a greater amount of heat dissipation than would otherwise be provided by the passive heat sink 30 alone. Preferably the first rate of heat rejection is sufficient to maintain each of the electrical components 26 within a maximum operating temperature range that allows the electrical components 26 to perform their required function as long as there are only a limited number of operating occurrences at the maximum operating temperature range, with each occurrence being for a limited, rather than a sustained, period of time. This allows the electronic assembly 10 to operate for a limited period of time for a limited number of occasions when the forced coolant air flow from the source 16 is interrupted, either unintentionally because of a failure, or intentionally because the current temperature of the coolant air flow is too high to perform the required cooling.

While the chassis 20 may be of any suitable construction to mount a plurality of electrical components for operation, it is preferred that the chassis 20 provide EMI shielding for the electrical components 26 and further provide an enclosed interior cavity that restricts and/or prevents active air flow over the electrical components 26. Thus, in the preferred embodiment, the chassis 20 is formed from a suitable metallic material in the shape of a box having six walls 40, with the heat exchanger 28 being on one of the six walls 40. In one preferred embodiment, the chassis 20, the passive heat sink 30, and the active heat sink 32 are a unitary casting. In another embodiment, the chassis 20, the passive heat sink 30, and the active heat sink 32 are separate component piece parts that are fixed together in an assembled state by any suitable means, such as by bolting, brazing or epoxy. The heat sinks 30 and 32 can be of any suitable construction, such as, for example, in the form of castings, machinings, or brazed plate/fin assemblies. It is preferred that fins 42 be provided on the passive heat sink 30, with the fins 42 being of any suitable construction, such as planar fins or pin fins.

Further, fins acting as turbulator and/or heat conductors can be provided in the one or more coolant passages 34 to improve the effectiveness of the active heat sink 32. While in the embodiment shown in FIG. 2, the coolant passages 34 are shown having rectangular flow cross sections, any flow cross section, may be used for the one or more coolant passages 34. Further, while the coolant passages 34 are illustrated in FIGS. 1 and 2 as linear coolant passages that extend from one end 50 of the active heat sink 32 to the other end 52 of the active heat sink 32, the coolant passages 34 may be of any suitable configuration, such as serpentine, radial, or spiral. Similarly, while the passive and active heat sinks 30 and 32 are shown as being essentially rectangular in configuration, they may be provided in any suitable shape that will provide the required functions.

While any type of electrical component may be mounted within the cavity 24 of the chassis 20, in the preferred embodiment, the electrical components can be classified into three general groups as follows:

1. power electronics, such as semi-conductors, transformers, diodes, etc.;
2. electromagnetics, such as transformers, inductors, etc.; and
3. printed wire boards or circuit boards having a number of electrical components mounted thereon.

Preferably, the electrical components 26 are mounted in the chassis 20 such that the components 26 requiring the most cooling are mounted with the most direct conduction path through the chassis to the heat exchanger 28, such as on the interior surface 44 of the chassis 20. The electrical components 26 having a relatively moderate cooling requirement may be mounted further from the heat exchanger 28, such as on one of the interior side surfaces 46 of the chassis 20, while the electrical components 26 requiring the least amount of cooling, may be mounted in a location that is the most remote from the heat exchanger 28, such as on the interior surface 48, or spanning the side surfaces 46.

It should be appreciated that the electronic assembly allows for electronic components 26 to be mounted within a chassis 20 while providing an increased heat dissipation capacity for the components 26 through the active heat exchanger 34 and allowing the electronic components to operate when the coolant air flow through the active heat exchanger 34 is occasionally interrupted for limited periods of time.

What is claimed is:

1. An electronic assembly including fault tolerant cooling, said assembly comprising:

a chassis having an exterior surface and an interior cavity;
   a plurality of heat generating electrical components mounted in the cavity and in heat exchange relation to the chassis to reject generated heat to the chassis; and
   a fault tolerant heat exchanger on the exterior surface of the chassis and in heat exchange relation with the chassis, the heat exchanger including
   a passive heat sink to reject said generated heat at a first rate from said chassis to an environment surrounding said chassis via radiation and natural convection, and
   an active heat sink, including at least one coolant passage, to reject said generated heat at a second rate from said chassis to a coolant that is flowed through said at least one active coolant passage, said second rate being greater than said first rate, the active heat sink including a conductive thermal path from said chassis to said passive heat sink to reject said generated heat at said first rate from said chassis to said passive heat sink with no coolant being flowed through the active heat sink.

2. The electronic assembly of claim 1 wherein said active and passive heat sinks are a unitary part of the chassis.

3. The electronic assembly of claim 1 wherein said active and passive heat sinks are separate components that are fixed to the chassis in an assembled state.

4. The electronic assembly of claim 1 wherein said passive heat sink comprises a plurality of pin fins.

5. The electronic assembly of claim 1 wherein said at least one coolant passage comprises a plurality of coolant passages each having a nominally rectangular flow cross-section.

6. The electronic assembly of claim 1 wherein said interior of said chassis is enclosed to prevent air flow over said heat generating electrical components.

7. The electronic assembly of claim 1 wherein said chassis has a box shape defined by six exterior walls and said fault tolerant heat exchanger is on one of the six exterior walls.

8. The electronic assembly of claim 1 wherein said chassis comprises a metallic material and is designed to provide EMI shielding for said heat generating electrical components.

9. The electronic assembly of claim 1 wherein said fault tolerant heat exchanger comprises a metallic material.

* * * * *